United States Patent [19]

Mitchell et al.

[11] Patent Number: 5,143,860
[45] Date of Patent: Sep. 1, 1992

[54] HIGH DENSITY EPROM FABRICAITON METHOD HAVING SIDEWALL FLOATING GATES

[75] Inventors: Allan T. Mitchell, Garland; Bert R. Riemenschneider, Murphy; Howard L. Tigilaar, Alien, all of Tex.

[73] Assignee: Texas Instruments Incorporated, Dallas, Tex.

[21] Appl. No.: 686,734

[22] Filed: Apr. 17, 1991

Related U.S. Application Data

[62] Division of Ser. No. 137,401, Dec. 23, 1987, abandoned.

[51] Int. Cl.[5] .............................................. H01L 21/44
[52] U.S. Cl. ........................................ 437/43; 437/44; 437/49; 437/195
[58] Field of Search ................ 437/43, 44, 52, 195, 437/49, 45; 357/23.5

[56] References Cited

U.S. PATENT DOCUMENTS

| | | | |
|---|---|---|---|
| 4,358,340 | 11/1982 | Fu | 437/43 |
| 4,405,995 | 9/1983 | Shirai et al. | 357/23.5 |
| 4,419,809 | 12/1983 | Riseman et al. | 437/44 |
| 4,442,589 | 4/1984 | Doo et al. | 437/44 |
| 4,698,900 | 10/1987 | Esquivel | 437/52 |
| 4,729,966 | 3/1988 | Koshino et al. | 437/44 |
| 4,734,887 | 3/1988 | Sugatani | 357/23.5 |
| 4,794,565 | 12/1988 | Wu et al. | 357/23.5 |
| 4,833,514 | 5/1989 | Esquivel et al. | 437/43 |
| 4,997,781 | 3/1991 | Tigelaar | 437/43 |

FOREIGN PATENT DOCUMENTS

| | | | |
|---|---|---|---|
| 0065576 | 4/1985 | Japan | 357/23.5 |
| 0170264 | 9/1985 | Japan | 357/23.5 |
| 0058272 | 3/1986 | Japan | . |
| 0256673 | 11/1986 | Japan | 357/23.5 |
| 0094987 | 5/1987 | Japan | 357/23.5 |

Primary Examiner—Brian E. Hearn
Assistant Examiner—C. Chaudhari
Attorney, Agent, or Firm—W. James Brady, III; Lawrence J. Bassuk; Richard L. Donaldson

[57] ABSTRACT

An EPROM memory having sidewall floating gates (30) is disclosed. Sidewall floating gates (30) are formed on sidewalls (28) of field insulators (24). Spaced apart bit lines (22), which serve as memory cell sources and drains, are formed. The field insulators (24) overlie the bit lines (22), and sidewall floating gates are formed on the sidewalls (28) of the field insulators (24). In one embodiment, a second set of bit lines (36) is formed between the sidewall floating gates (30), and each memory cell contains one sidewall floating gate (30). In another embodiment, each memory cell contains two sidewall floating gate (30), and the memory cell may be programmed to store from two to four distinct information states.

7 Claims, 3 Drawing Sheets

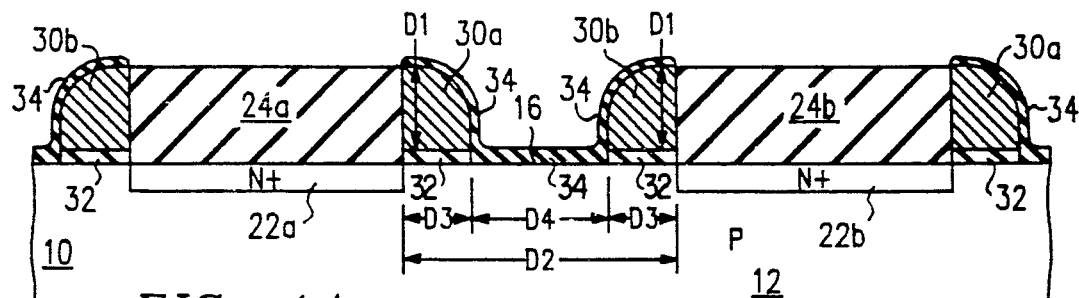
FIG. 4A
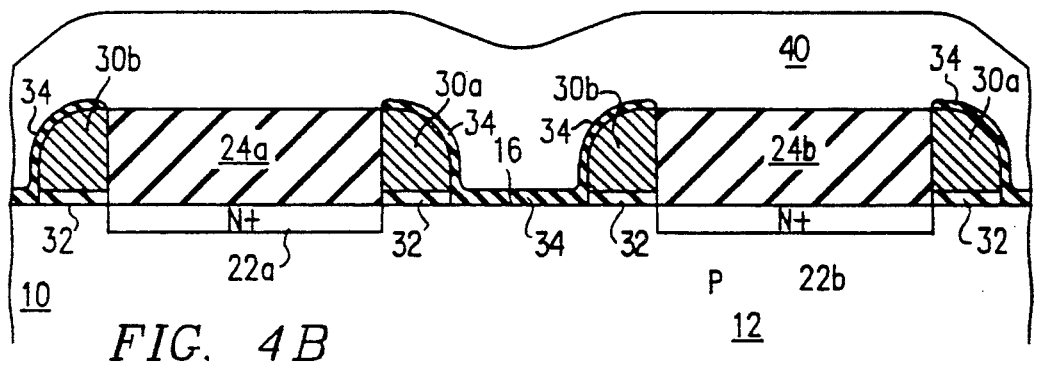
FIG. 4B
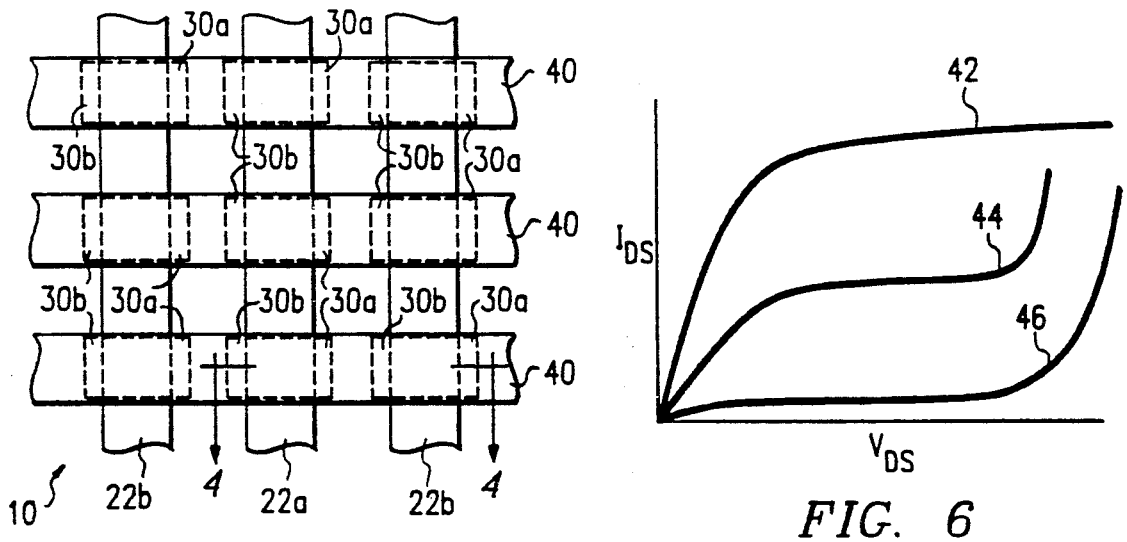
FIG. 5
FIG. 6

HIGH DENSITY EPROM FABRICAITON METHOD HAVING SIDEWALL FLOATING GATES

This is a division, of application Ser. No. 07/137,401, now abandoned filed Dec. 23, 1987.

FIELD OF THE INVENTION

This invention relates to the field of electrically programmable read only memory (EPROM) semiconductor devices. Specifically, the present invention relates to an EPROM having a minimized cell area due to floating gate structures contained therein.

BACKGROUND OF THE INVENTION

One of the goals in the fabrication of electrically programmable read only memories (EPROMs) is the production of a memory circuit which is capable of storing a maximum amount of information using a minimum amount of semiconductor surface area. However, photolithographic limits imposed by conventional semiconductor processing technology impede the achievement of this goal. Thus, an inability to pattern and etch semiconductor features closer together prevents a memory cell from occupying a smaller portion of a semiconductor's surface area.

EPROMs often utilize a floating gate avalanche injection MOS (FAMOS) structure to store programmed information. Floating gate dimensions in a FAMOS memory cell are conventionally established with reference to minimum photolithographic limits, and therefore produce undesirably large memory cells.

One solution to this problem of dimensioning a floating gate at minimum photolithographic limits is provided by the use of a sidewall floating gate formed on a sidewall of a control gate. However, since the floating gate is merely added to a sidewall of an ordinary, photolithographically defined control gate, the resulting structure is actually larger than a structure achievable at minimum photolithographic limits. In addition, it provides an undesirably diminished capacitive coupling between the floating gate and the control gate. Accordingly, a need exists for a memory cell in which a floating gate structure is provided with dimensions less than minimum photolithographic limits, but which is not formed on a sidewall of a control gate.

SUMMARY OF THE INVENTION

Accordingly, it is an advantage of the present invention that an EPROM memory cell is provided wherein the memory cell has a sidewall floating gate formed on a sidewall of a field insulator. An increase in memory density results.

Another advantage of the present invention is that an EPROM is provided with a sidewall floating gate formed on a sidewall of a field insulator so that the surface of the floating gate having the largest area of the floating gate surfaces faces a control gate. Increased capacitive coupling between the floating gate and the control gate results.

The above and other advantages of the present invention are carried out in one form by an EPROM having first and second regions of one conductivity type formed on a semiconductor surface so that the first and second regions function as source and drain for the memory cell. A channel region resides between the first and second regions on the semiconductor surface. A first field insulator is formed over the first region, and a second field insulator is formed over the second region. The second field insulator has a sidewall which faces the first field insulator and extends away from the semiconductor surface. A sidewall floating gate is formed on the second field insulator sidewall so that it is adjacent to and insulated from the channel region.

BRIEF DESCRIPTION OF THE DRAWINGS

A more complete understanding of the present invention may be derived by referring to the detailed description and claims when considered in connection with the accompanying drawings, in which like reference numbers indicate like features throughout the drawings, and wherein:

FIGS. 4A-4B are schematic cross-sectional sideview diagrams depicting the processing steps necessary to bring the EPROM memory of FIG. 1D to a control gate fabrication stage in accordance with a second embodiment of the present invention;

FIG. 5 is a plan view of a portion of the EPROM of FIG. 4B illustrating a line 4—4 which indicates the cross-section represented in FIGS. 4A-4B; and FIG. 6 shows voltage versus current curves applicable to read operations of the second embodiment of the present invention.

DETAILED DESCRIPTION

FIGS. 1A-1D illustrate initial processing steps for the fabrication of an EPROM memory array 10 according to the teaching of the present invention. Subsequently, the process steps illustrated by FIGS. 2A-2B may be performed upon the structure described in FIG. 1D to complete a first embodiment of the present invention. Alternatively, the steps depicted in FIGS. 4A-4B may be performed upon the structure described in FIG. 1D to complete a second embodiment of the present invention.

Memory array 10 contains a multiplicity of memory cells. Typically, all memory cells within memory array 10 are constructed as a result of the same process steps, and therefore all cells are similar in structure. Consequently, the entire array 10 of memory cells is described herein by reference to only the few cells depicted in FIGS. 1A-1D, 2A-2B, and 4A-4B. It will be understood by those skilled in the art that many memory cells may reside both to the left and the right of the cells depicted in FIGS. 1A-1D, 2A-2B, and 4A-4B. All distances extending in this dimension of memory array 10 are characterized as widths herein. In addition, many memory cells may reside both above and below the cells shown in FIGS. 1A-1D, 2A-2B, and 4A-4B. All distances extending in this dimension are referred to as lengths herein.

Figure 1A:
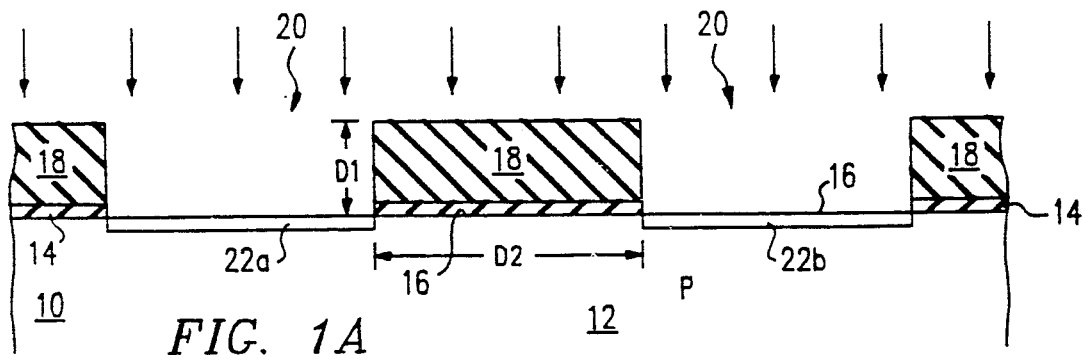
FIGS. 1A-1D are schematic cross-sectional sideview diagrams that depict the processing steps necessary to bring an EPROM memory according to the teaching of the present invention to a sidewall floating gate filament fabrication stage.

Array 10 includes of a P-type substrate 12 upon which the initial processing steps depicted in FIG. 1A operate. First, a thin oxide layer 14 is formed at a semiconductor substrate surface 16 of substrate 12. Oxide layer 14 may advantageously be grown in a dry oxygen or steam environment at a temperature of approximately 900° C. until a thickness of approximately 350 angstroms has been achieved. Oxide layer 14 covers the entire surface 16 of array 10. After the formation of oxide layer 14, a nitride layer 18 is formed overlying oxide layer 14 to a thickness indicated as distance D1 in FIG. 1A. Distance D1 varies depending upon whether the first embodiment or the second embodiment (discussed below) of the present invention is being fabricated. A conventional low pressure chemical vapor deposition (LPCVD) process may be used to apply nitride layer 18 overlying the entirety of memory array 10.

After the application of nitride layer 18 over the entire surface 16 of array 10, a conventional pattern and etch process removes portions of nitride layer 18 and oxide layer 14 to expose portions of surface 16 on substrate 12. The exposed portions reside within slots 20, which are approximately one micron wide in the preferred embodiments of the present invention and are spaced apart from each other by a distance D2. Distance D2 varies depending upon whether the first or second embodiment of the present invention is being fabricated. Moreover, slots 20 extend the entire length of memory array 10. Thus, slots 20 form substantially parallel lines.

After the formation of slots 20, an ion implantation procedure implants an N dopant into substrate 12 at surface 16 within slots 20. Although any conventional N. dopant may be used, the preferred embodiments of the present invention utilize arsenic at a concentration of approximately 5E15 atoms/cm$^2$ and an energy level of approximately 60 KEV. Arsenic is preferred over, for example, phosphorous because arsenic diffuses away from the area in which it is implanted less than phosphorous. As a consequence of implanting the dopant ions, N+ bit or column lines 22a and 22b are formed at surface 16 in substrate 12. Bit lines 22a-22b function as sources and drains for memory cell transistors and extend the entire length of array 10. The preferred process additionally refrains from annealing the implanted arsenic dopant immediately after the implantation so that bit lines 22a-22b will not diffuse laterally towards one another any more than necessarily occurs through the performance of subsequent processing steps.

Figure 1B:
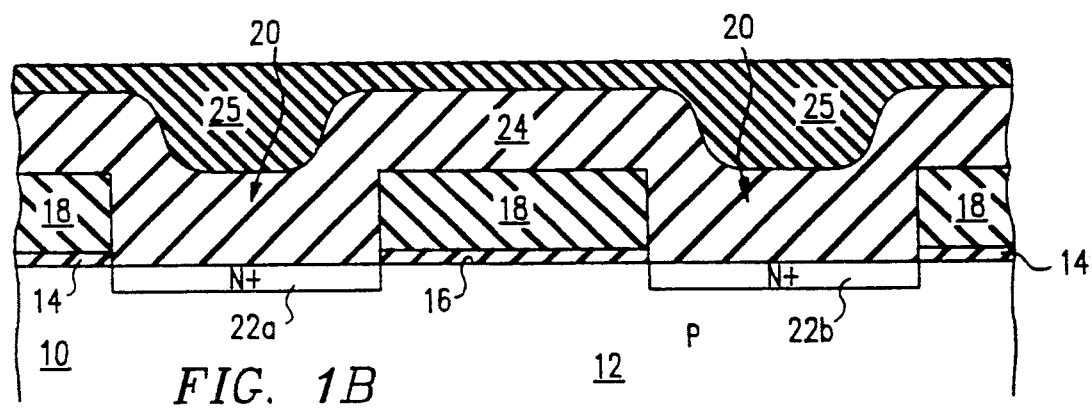

Referring to FIG. 1B, a field insulator layer 24 is next formed over the entire surface of memory array 10. Field insulator layer 24 is deposited to a thickness greater than distance D1 (see FIG. 1A). Consequently, layer 24 completely fills slots 20. Layer 24 may advantageously be a tetraethylorthosilicate (TEOS) oxide which is deposited using a chemical vapor deposition process. A planarizing resist coat 25 is next spun on the entire surface of memory array 10 overlying field insulator layer 24. The purpose of resist coat 25 is to provide a smooth, planar surface overlying the entire memory array 10, parallel to surface 16 of substrate 12.

Figure 1C:
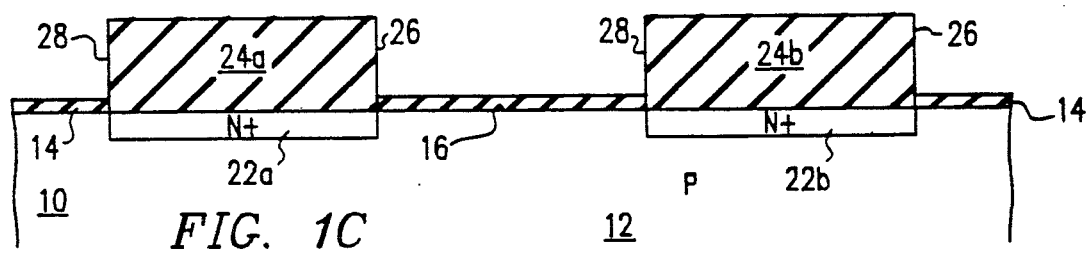

Referring now to FIGS. 1B and 1C, it can be seen that the preferred process of the present invention next etches the entire surface of memory array 10 back until the top portion of nitride layer 18 becomes exposed. This etch-back step uses an etchant having an approximately 1:1 selectivity ratio between resist coat 25 and field insulator layer 24. Accordingly, resist coat 25 and layer 24 etch at substantially the same rates, and the smooth, planar surface previously of resist coat 25 now appears at the top surface of nitride layer 18. At this point in the process, field insulator layer 24 resides adjacent to nitride layer 18 within slots 20. Furthermore, the tops of nitride layer 18 and field insulator layer 24 are substantially coplanar (not shown). Next, nitride layer 18 is etched away using an isotropic etch which is highly selective to oxide. Thus, oxide layer 14 and field insulator layer 24 remain on surface 16 of memory array 10, as shown in FIG. 1C.

Field insulator layer 24 has now been etched into individual field insulators, which are referred to as field insulators 24a and 24b in FIG. 1C. Field insulators 24a and 24b extend the entire length of memory array 10 overlying bit lines 22a and 22b, respectively, which also extend the entire length of memory array 10. Each of field insulators 24a and 24b has sidewalls 26 and 28 on opposing sides thereof. Sidewall 26 of field insulator 24a faces sidewall 28 of field insulator 24b. Moreover, each of sidewalls 26 and 28 is substantially perpendicular to surface 16 of substrate 12. This perpendicular feature improves the fabrication of a sidewall floating gate, which occurs next.

Figure 1D:
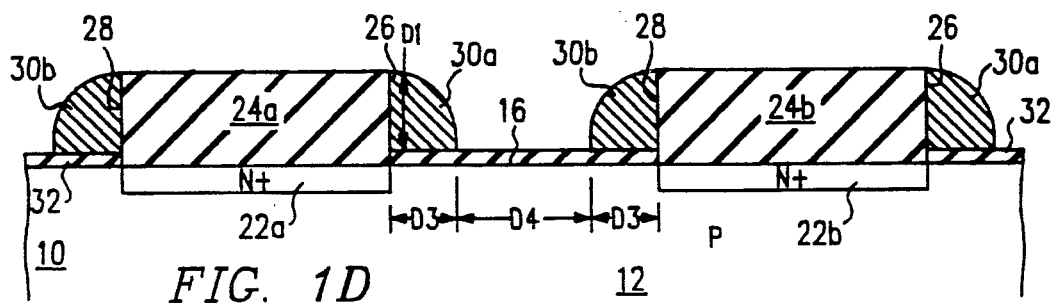

In accordance with the process steps depicted in FIG. 1D, an anisotropic dry etch is used to remove oxide 14 (see FIG. 1C) from surface 16 of substrate 12 so that a high quality gate oxide 32 may be grown in its place using, for example, a dry oxygen environment. Those skilled in the art will understand that a thin layer portion of field insulators 24a and 24b may be sacrificed by this etching, but that only an insubstantial effect on the overall thickness of field insulators 24a and 24b results. Gate oxide 32 may advantageously be grown to a thickness of approximately 350 angstroms.

After formation of gate oxide 32, a polycrystalline silicon (poly) layer is deposited overlying the entire surface of memory array 10. This poly layer will form sidewall floating gate filaments 30a and 30b after an etching step, discussed below. The thickness at which this poly layer is deposited depends upon a desired resulting width D3 for sidewall floating gate filaments 30a-30b. This width may vary depending upon whether the first or second embodiment of the present invention is being fabricated. This poly layer is deposited to a thickness greater than D3.

After the deposition of this poly layer, the poly layer is doped in POCl$_3$, for example, and then anisotropically etched using an etchant which is selective to oxide. As a result, sidewall floating gate filaments 30a and 30b are formed on sidewalls 26 and 28, respectively, overlying gate oxide 32. The cross sectional view of each of sidewall floating gate filaments 30a-30b resembles a square if a highly conformal poly deposition and highly anisotropic etch are used. On the other hand, if a less conformal poly deposition or a slightly isotropic etch are used, the cross section resembles a geometrical sector having approximately 90° between sector radii, as shown in FIG. 1D. Thus, the boundary between a sidewall floating gate filament 30a or 30b and a field insulator 24a or 24b at a sidewall 26 or 28, respectively, represents one side of the square or one of the sector radii. The boundary between a sidewall floating gate filament 30a or 30b and gate oxide 32 represents another side of the square or the other of the sector radii. The two remaining square sides or the sector arc, which is exposed at this stage of the process, defines a surface over the length of a sidewall floating gate filament 30a or 30b which has a greater surface area than either of the surfaces defined by the sector radii or individual square sides over the length of the filament. This relationship enhances capacitive coupling between a sidewall floating gate filament 30a or 30b and a later-formed control gate (not shown) by providing the largest surface of the sidewall filament 30a–30b for such coupling.

At this sidewall floating gate filament fabrication stage in the process, sidewall floating gate filaments 30a–30b extend the entire length of memory array 10. Moreover, gate oxide 32 remains exposed between filaments 30a and 30b in strips which exhibit a width equivalent to a distance D4 and extend the entire length of memory array 10. Distance D4 varies depending upon whether the first or second embodiment of the present invention is being fabricated. The perpendicular nature of sidewalls 26 and 28 (discussed above) allows width D3 to be as large as possible overlying gate oxide 32.

Figure 2A:
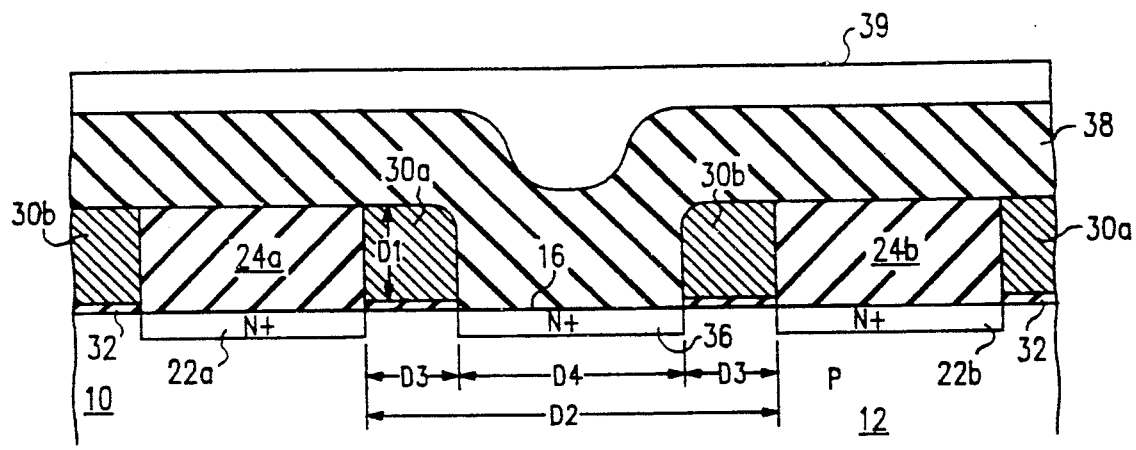
FIGS. 2A-2B are schematic cross-sectional sideview diagrams depicting the processing steps necessary to bring the EPROM memory of FIG. 1D to a control gate fabrication stage in accordance with a first embodiment of the present invention.
Figure 2B:
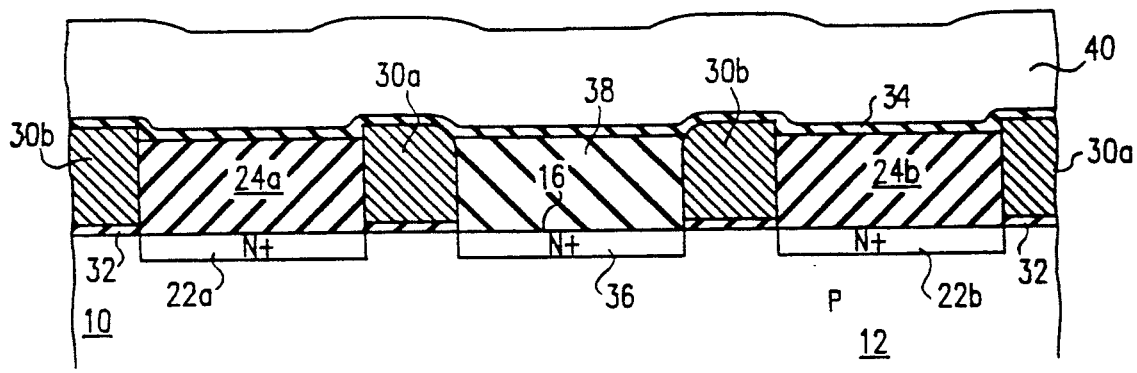

FIGS. 2A and 2B illustrate process steps which relate specifically to the first embodiment of the present invention. For this embodiment of the present invention, distance D1 is preferably around 5,000 angstroms, distance D2 is approximately two microns, distance D3 is approximately 5,000 angstroms, and distance D4 is approximately one micron. Accordingly, using the structure discussed above in connection with FIG. 1D, a one micron wide strip of gate oxide 32 remains exposed throughout the entire length of memory array 10. Referring to FIG. 2A, the above-discussed square cross sectional shape is shown for sidewall floating gate filaments 30a–30b. Next, the one micron wide strip of gate oxide 32 is removed using an anisotropic etchant which is selective to silicon. This etching step may sacrifice a thin layer portion of field insulators 24a–24b, but no harm results from the sacrifice. An ion implantation step implants dopant ions into surface 16 of substrate 12 between sidewall floating gate filaments 30a and 30b. The preferred embodiment utilizes arsenic at a density of approximately 5E15 atoms/cm$^2$ and an energy level of approximately 50 KEV. As a result, a bit or column line 36 is formed at surface 16 of substrate 12 between and spaced apart from bit lines 22a–22b.

A deposited TEOS oxide 38 is next formed overlying the entire substrate 12. In this embodiment oxide 38 is deposited to a thickness of greater than 5,000 angstroms so that it fills the one micron wide strip between sidewall floating gate filaments 30a and 30b. After the deposition of oxide 38, a planarized resist coat 39 is spun on, as shown in FIG. 2A. Next, resist coat 39 and oxide 38 are etched back to expose the top surfaces of sidewall floating gate filaments 30a–30b, as shown by FIG. 2B. This planarizing etch process is similar to the one described above in connection with FIG. 1B. Slight overetching during this planarization exposes sides of sidewall floating gate filaments 30a–30b and therefore increases the coupling between sidewall floating gate filaments 30a–30b and the later-formed control gate. An interlevel insulator 34 is next grown or deposited overlying sidewall floating filaments 30a–30b, field insulators 24a–24b, and oxide 38. Interlevel insulator 34 may be an approximately equivalent to a 350 angstrom thick layer of oxide, and may be a multiple layer dielectric such as 150 angstroms of oxide under 150 angstroms of Nitride.

After the formation of interlevel insulator 34, a poly layer is deposited using a conventional LPCVD process to a thickness of approximately 4,000–4,500 angstroms over the entire surface of memory array 10 and then POCl$_3$ doped. This poly layer is then patterned to form a control gate 40, as discussed below. The result is shown in FIG. 2B.

Figure 3:
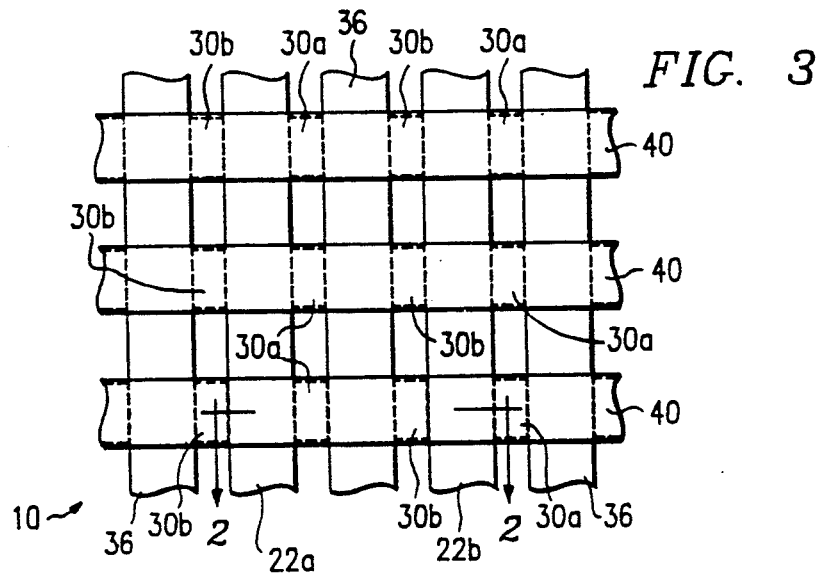
FIG. 3 is a plan view of a portion of the EPROM of FIG. 2B illustrating a line 2—2 which indicates the cross-section represented in FIGS. 2A-2B.

Control gate 40 represents a word or row line that extends the entire width of memory array 10, as shown in the plan view of FIG. 3. In the preferred embodiment, control gates 40 are approximately one micron long and spaced approximately one micron apart. The etching step which forms control gates 40 from the poly layer that overlies the entire surface of memory array 10 requires three substeps. For a first substep, a mask (not shown) is applied overlying the entire surface area of memory array 10 so that openings through the mask reside between control gates 40. The poly layer is anisotropically etched using an etchant which is selective to oxide. Referring back to FIG. 2B, this anisotropic etch etches in the vicinity of the mask openings down through the poly layer from which control gate 40 is formed, but stops at interlevel insulator 34 due to the selective nature of the etchant. Second, an isotropic etch which is not selective to oxide is applied for a short period of time to remove interlevel insulator 34 overlying sidewall floating gate filaments 30a–30b. This etch sacrifices a small quantity of oxide from field insulator 24 and field insulator 38 between control gates 40 (see FIG. 3). Third, an anisotropic etch which is selective to oxide is used to cut through sidewall floating gate filaments 30a–30b so that individual sidewall floating gates 30a–30b remain underlying control gates 40, as shown in FIG. 3.

Finally, conventional finishing steps (not shown) are performed, such as applying approximately 1,000 angstroms of TEOS oxide, followed by 4,000 to 5,000 angstroms of phosphosilicate glass (PSG) and metallic layers.

Referring back to FIG. 2B, it can be seen that a memory cell pair having two memory cells is shown. One memory cell contains bit line 22a and sidewall foating gate 30a. Another memory cell contains bit line 22b and sidewall floating gate 30b. Each of the memory cells includes bit line 36 and control gate 40. Thus, bit line 36 is shared between the memory cells of the memory cell pair. In addition, each of bit lines 22a–22b are shared between the memory cells of the memory cell pair shown in FIG. 2B and adjacent memory cells (not shown) to the left and right of the pair shown in FIG. 2B. One channel region located in substrate 12 near surface 16 and between bit lines 22a and 36 results. Another channel region is located in substrate 12, near surface 16, and between bit lines 36 and 22b. Each of the memory cells of the memory cell pair has only one of sidewall floating gates 30a–30b.

Memory cells are programmed by causing hot electrons to be injected through gate oxide layer 32 onto floating gates 30a–30b. This injection of electrons occurs under the influence of a relatively strong electrical field. Once the strong electrical field has been removed, these electrons are trapped on floating gates 30a–30b causing the memory cell to be programmed. Accordingly, the memory cells may be programmed by placing a memory cell transistor source, such as one of bit lines 22a and 22b at a zero volt potential while placing control gate 40 at a relatively high positive voltage potential and pulsing a memory cell transistor drain, such as bit line 36 with a relatively high voltage. This process causes one of the sidewall floating gates 30a–30b which resides between one of the bit lines 22a–22b held at a zero volt potential and bit line 36 to become programmed.

A memory cell may be read by placing a memory cell transistor source such as bit line 36 at a zero volt potential, a memory cell transistor drain, such as one of bit lines 22a and 22b, at a relatively low positive voltage, and a memory cell transistor control gate, such as control gate 40, at a relatively low positive voltage. If the memory cell has not been previously programmed, then the memory cell conducts current. However, if the memory cell has been previously programmed, floating gate 30a-30b will prevent the memory cell from conducting.

Thus, the first embodiment of the present invention discussed above includes two memory cells in a space which is approximately three microns in width by two microns in length. The memory cell pair contains two memory cells and is therefore capable of storing two bits of information. It will be understood by those skilled in the art that two bits of information together define four distinct information states. These four information states may be represented as: 00, 01, 10, and 11, wherein the first numeral describes a logical state of a first bit, and the second numeral describes a logical state of a second bit.

The second embodiment of the present invention, which is described in FIGS. 4A, 4B, 5, and 6, allows two to four distinct information states to be stored in a single memory cell having a width of approximately two microns and a length of approximately two microns. Referring specifically to FIG. 4A, a processing step in accordance with this second embodiment is performed on the structure shown in FIG. 1D and described above. In this second embodiment distance D1 is approximately 4,000 angstroms, distance D2 is approximately one micron, distance D3 is approximately 2,500 angstroms, and distance D4 is approximately 5,000 angstroms. Thus, distances D1-D4 are generally smaller in this second embodiment than those described above in connection with the first embodiment.

After the formation of sidewall floating gate filaments 30a-30b as described above in connection with FIG. 1D, gate oxide 32 is removed from the structure shown in FIG. 1D in the area between sidewall floating gates 30a and 30b overlying surface 16 of substrate 12. Gate oxide 32 is removed through an etching step which applies a silicon-selective etchant without the use of a mask. This etching step may sacrifice a thin layer portion of field insulators 24a-24b, but no harm results from such sacrifice.

Next, interlevel insulator 34 is grown overlying sidewall floating gate filaments 30a-30b and overlying substrate 12 between sidewall floating gate filaments 30a-30b. Interlevel insulator 34 may advantageously be an oxide which is thermally grown to a thickness of approximately 350 angstroms. The structure shown in FIG. 4A results.

FIG. 4B illustrates a subsequent processing step in which a poly layer is deposited overlying the entire surface area of memory array 10. This poly layer is applied using a conventional LPCVD technique to a thickness of approximately 4,000–4,500 angstroms and doped with an appropriate dopant, such as POCl. Next, the poly layer is patterned and etched into control gates 40 as shown in FIG. 4B and in the plan view of FIG. 5. This step additionally etches sidewall floating gate filaments 30a-30b into individual sidewall floating gates 30a-30b which underlie control gates 40. As discussed above in connection with the first embodiment, this pattern and etch step may require three separate substeps wherein the first substep forms control gates 40, a second substep removes interlevel insulator 34 (see FIG. 4B) and the third substep then etches sidewall floating gates 30a-30b. As shown in FIG. 5, bit lines 22a-22b extend the entire length of memory array 10, and control gates 40 extend the entire width of memory array 10. Furthermore, two sidewall floating gates 30a and 30b reside at each intersection between a control gate 40 and a bit line 22a-22b.

Referring to FIG. 4B, a single memory cell is shown which contains a source, such as one of bit lines 22a-22b, a drain, such as the other of bit lines 22a-22b, two sidewall floating gates 30a-30b, and a control gate 40. A channel region located in substrate 12, near surface 16, and between bit lines 22a and 22b results. Accordingly, sidewall floating gate 30a, sidewall floating gate 30b, and control gate 40 all overlie the channel region in this second embodiment.

This memory cell may be programmed to store up to four distinct information states. For example, a first information state may be represented by leaving both of sidewall floating gates 30a and 30b unprogrammed. A second information state may be represented by programming only sidewall floating gate 30a and not sidewall floating gate 30b. In, addition, a third information state may be represented by programming only sidewall floating gate 30b and not sidewall floating gate 30a, and a fourth information state may be represented by programming both sidewall floating gates 30a and 30b.

Sidewall floating gate 30a is programmed by applying a zero volt potential to bit line 22b, which represents a source of the memory cell, applying a relatively high positive voltage on control gate 40, and then pulsing bit line 22a, which represents a drain of the memory cell, at a relatively high positive voltage. Likewise, floating gate 30b is programmed by applying a zero volt potential to bit line 22a, which now represents the source for the memory cell, applying a relatively high voltage to control gate 40, and then pulsing bit line 22b, which now represents the drain for the memory cell, at a relatively high positive voltage. Both of floating gates 30a and 30b within a memory cell may be programmed in two steps by first programming one of sidewall floating gates 30a and 30b as discussed above, then programming the other of sidewall floating gates 30a and 30b, as discussed above.

A memory cell is read to know the information state programmed therein. A particular memory cell is read by applying moderate voltages, such as in the range of three-five volts, to a particular source, drain, and control gate that uniquely define the memory cell. FIG. 6 shows a graph of relationships between drain-to-source voltage and current which occur when reading a memory cell. The above-described four distinct information states may be detected by sensing current flowing in the cell under various conditions. For example, a curve 42 represents a memory cell transistor's ability to conduct current during a read operation when neither of sidewall floating gates 30a and 30b are programmed. In this situation the memory cell conducts a relatively large amount of current at a relatively low or moderate drain-to-source voltage potential. Furthermore, it makes no difference which of bit lines 22a and 22b are used as the memory cell source and drain for the read operation.

A curve 44 shows the electrical behavior of the memory cell during a read operation when only sidewall floating gate 30a has been programmed and the memory cell is being read with bit line 22a serving as the memory cell drain. In addition, curve 44 depicts the voltage-current relationship which results during a read operation when only sidewall floating gate 30b has been programmed and the memory cell is being read with bit line 22b serving as the memory cell drain. For both of these situations the memory cell conducts a moderate amount of current when a moderate voltage potential is applied across the drain and source.

Moreover, a single curve 46 shown in FIG. 6 illustrates the performance of the memory cell during a read operation for each of three different situations. For example, the response illustrated by curve 46 occurs when both of sidewall floating gates 30a and 30b have been programmed. Additionally, this response occurs when only sidewall floating gate 30a has been programmed and the memory cell transistor is being read with bit line 22b serving as the memory cell drain. Moreover, this response occurs when only sidewall floating gate 30b has been programmed and the memory cell is being read with bit line 22a serving as the memory cell drain. In each of these three situations a relatively low amount of current flows through the memory cell when a moderate voltage potential is applied to the memory cell drain and source.

Thus, as FIG. 6 suggests, a first information state may be detected by reading the memory cell with either of bit lines 22a or 22b serving as the drain. Detection of a relatively high current level when a moderate voltage potential is applied across the bit lines 22a and 22b indicates that the memory cell has been programmed to store the first distinct information state. One technique of operating the memory cell programs the memory cell to store one of only two distinct information states. With this option, if a low or moderate amount of current is conducted through the memory cell when a voltage potential is applied across bit lines 22a and 22b, then the second of two information states has been detected.

However, if the memory cell has been programmed to contain one of three or four distinct information states, then two successive read operations are performed in order to distinguish between the second through fourth possible information states. The two read operations first use one of bit lines 22a and 22b as a memory cell drain, then use the other of bit lines 22a and 22b as a drain. If a moderate amount of current is detected at the first read operation and then a low amount of current is detected during the second read operation, one of the second through fourth information states has been detected. If a low amount of current and then a moderate amount of current are detected in two successive read operations, a second one of the second through fourth information states has been detected. Finally, if a low amount of current is detected during both the first and second read operations, a fourth one of the second through fourth information states has been detected.

In summary, a memory array having sidewall floating gates and a control gate which extends the width of the memory array perpendicular to the direction of memory array bit lines has been described herein. As a consequence of this structure, one embodiment of the present invention stores four information states (two bits of information) in an area approximately three microns in width and approximately two microns in length. In a second embodiment of the present invention, from two to four information states (one or two bits of information) may be stored in an area which is approximately two microns in width by two microns in length. Of course, those skilled in the art will recognize that these dimensions reflect current processing capabilities and that such dimensions may decrease as a result of improvements in semiconductor processing techniques.

In addition, the sidewall floating gates provided in the present invention permit the largest surface of each sidewall floating gate to couple to the control gate so that an increased capactive coupling results. The increased capacitive coupling permits the programming of memory cells with lower voltages, and the use of lower voltages permits memory cell features to be located closer to each other without risking voltage breakdown problems.

The foregoing description uses preferred embodiments and processes to illustrate the present invention. However, those skilled in the art will recognize that changes and modifications may be made in these embodiments without departing from the scope of the present invention. For example, the present invention described the implantation of bit lines 22a–22b. However, those skilled in the art will recognize that bit lines may alternatively be formed by fabricating a heavily doped polycrystalline silicon strip overlying a semiconductor substrate so that dopant ions diffuse out from the polycrystalline strip into the substrate and form a bit line. Then, a field insulator may be formed above and on sidewalls of the polycrystalline silicon strip, and sidewall floating gates may be formed on the field insulator substantially as described herein. In addition, those skilled in the art will recognize that the particular dimensions discussed herein are presented for the purposes of teaching the present invention and that they may easily change as semiconductor processing capabilities improve. These and other modifications obvious to those skilled in the art are intended to be included within the scope of the present invention.

What is claimed is:

1. A method of forming an electrically programmable memory on a substrate having a semiconductor surface area of a first conductivity type, said method comprising the steps of:

forming first and second spaced apart regions of a second conductivity type at the semiconductor surface, said first and second regions of said second conductivity type spaced apart by a first region of said first conductivity type at the semiconductor surface, said first region of said first conductivity type extending from said first region of said second conductivity type to said second region of said second conductivity type;

forming first and second field insulator regions overlying the first and second regions of said second conductivity type, respectively, so that said first and second field insulator regions have first and second sidewalls, respectively, the first sidewall facing the second sidewall and the first and second sidewalls extending away from the substrate surface; and forming first and second sidewall floating gates on the first and second sidewalls, respectively, said first and second sidewall floating gates spaced apart by a portion of said first region of said first conductivity type.

2. A method as claimed in claim 1 additionally comprising the step of forming a control gate overlying a surface of the first sidewall floating gate and a surface of the second sidewall floating gate.

3. A method as claimed in claim 2 wherein said step of forming a control gate comprises the steps of:
- forming a gate insulator on the semiconductor surface between the first and second regions of said second conductivity type; and
- extending the control gate toward the semiconductor surface between said first and second regions of said second conductivity type so that the control gate resides on the gate insulator.

4. A method as claimed in claim 1 wherein said forming field insulator regions step comprises the step of forming the first and second sidewalls to be substantially perpendicular to the semiconductor surface.

5. A method as claimed in claim 1 additionally comprising the step of forming a third region of the second conductivity type at the semiconductor surface, the third region of said second conductivity type being spaced apart form the first and second regions of said second conductivity type, and the third region of said second conductivity type residing between said first and second sidewall floating gates.

6. A method as claimed in claim 5 additionally comprising the steps of:
- forming a third field insulator region overlying the third region of said second conductivity type;
- forming a first interlevel insulator on a surface of the first sidewall floating gate;
- forming a second interlevel insulator on a surface of the second sidewall floating gate; and
- forming a control gate overlying the third field insulator, the first interlevel insulator, and the second interlevel insulator.

7. A method as claimed in claim 5 wherein said forming a third region of the second conductivity type comprises the step of implanting dopant ions into the semiconductor surface.

* * * * *